(12) United States Patent
Burney

(10) Patent No.: US 7,644,296 B1
(45) Date of Patent: Jan. 5, 2010

(54) PROGRAMMABLE LOGIC DEVICE INTEGRATED CIRCUITS WITH CONFIGURABLE DYNAMIC PHASE ALIGNMENT CIRCUITRY

(75) Inventor: Ali Burney, Fremont, CA (US)

(73) Assignee: Altera Corporation, San Jose, CA (US)

( * ) Notice: Subject to any disclaimer, the term of this patent is extended or adjusted under 35 U.S.C. 154(b) by 485 days.

(21) Appl. No.: 11/488,429

(22) Filed: Jul. 17, 2006

Related U.S. Application Data

(60) Provisional application No. 60/790,067, filed on Apr. 7, 2006.

(51) Int. Cl.
*G06F 1/04* (2006.01)
*G06F 1/06* (2006.01)
(52) U.S. Cl. ........................ 713/401; 713/501; 713/503
(58) Field of Classification Search .................. 713/400, 713/401, 501, 503, 600
See application file for complete search history.

(56) References Cited

U.S. PATENT DOCUMENTS

| | | | |
|---|---|---|---|
| 6,292,116 B1 * | 9/2001 | Wang et al. .................. | 341/100 |
| 6,985,096 B1 | 1/2006 | Sasaki et al. | |
| 7,003,423 B1 | 2/2006 | Kabani et al. | |
| 7,075,365 B1 | 7/2006 | Starr et al. | |
| 7,340,021 B1 * | 3/2008 | Churchill et al. ............ | 375/354 |
| 7,493,461 B1 * | 2/2009 | Thorne ........................ | 711/167 |

2001/0033188 A1  10/2001  Aung et al.

OTHER PUBLICATIONS

"Stratix II GX Transceiver Block Overview" Stratix II GX Device Handbook, vol. 2, pp. 1-1 to 1-8, Altera Corporation, Feb. 2006.
"Stratix II BX Physical coding Sub-Layer", pp. 1-3 printed from www.altera.com on Mar. 21, 2006, Altera Corporation.
"Stratix II GX Transceiver FPGAs Physical Medium Attachment Layer", pp. 1 and 2, printed from www.altera.com on Mar. 21, 2006, Altera Corporation.
"Source Synchronous Signaling in Stratix II Devices", pp. 1 and 2, printed from www.altera.com on Mar. 21, 2006, Altera Corporation.
"The Need for Dynamic Phase Alignment in High-Speed FPGAs v.1.1" [online]. Altera Corporation, Feb. 2004 [retrieved on Aug. 26, 2009]: <http://www.altera.com/literature/wp/wp_dpa.pdf>.

* cited by examiner

*Primary Examiner*—Dennis M Butler
(74) *Attorney, Agent, or Firm*—Treyz Law Group; G. Victor Treyz; Nancy Y. Ru

(57) ABSTRACT

Programmable logic device integrated circuits are provided that have configurable receivers with dynamic phase alignment capabilities. In situations in which receivers require dynamic phase alignment circuitry, programmable logic elements can be configured to implement a dynamic phase alignment data capture and synchronization circuit. In situations in which dynamic phase alignment receiver circuitry is not required, resources are made available for implementing other user logic. Multiple dynamic phase alignment receiver circuits can share an eight-phase dynamic phase alignment clock signal that is generated by a phase-locked-loop circuit. Switches may be configured to selectively route the dynamic phase alignment clock signal to desired locations on the programmable logic device integrated circuit.

20 Claims, 15 Drawing Sheets

| CHOSEN DPA CLOCK PHASE | DATA1 | | IS CHOSEN DPA CLOCK PHASE EDGE NEAR SYS CLK EDGE? | DATA MUX SETTING |
|---|---|---|---|---|
| | ZEROS | ONES | | |
| 0 | 9 | 1 | Y | A |
| 1 | 10 | 0 | N | B |
| 2 | 10 | 0 | N | B |
| 3 | 10 | 0 | N | B |
| 4 | 0 | 10 | N | B |
| 5 | 0 | 10 | Y | A |
| 6 | 3 | 7 | Y | A |
| 7 | 7 | 3 | Y | A |

FIG. 9

| CHOSEN DPA CLOCK PHASE | DATA1 | | DATA2 | | IS CHOSEN DPA CLOCK PHASE EDGE NEAR SYS CLK EDGE? | DATA MUX SETTINGS |
|---|---|---|---|---|---|---|
| | ZEROS | ONES | ZEROS | ONES | | |
| 0 | 0 | 10 | 10 | 0 | Y | A |
| 1 | 0 | 10 | 10 | 0 | Y | A |
| 2 | 3 | 7 | 2 | 8 | N | B |
| 3 | 7 | 3 | 3 | 7 | N | B |
| 4 | 10 | 0 | 0 | 10 | N | B |
| 5 | 10 | 0 | 0 | 10 | N | B |
| 6 | 7 | 3 | 2 | 8 | Y | A |
| 7 | 4 | 6 | 7 | 3 | Y | A |

| COMPONENT | 4-LUT | ML1 INPUT SETTING | REG. | ML2 INPUT SETTING |
|---|---|---|---|---|
| LE1 | R1 | N | 0 | Y(R1) | 0 |
| LE2 | R3 | N | 0 | Y(R3) | 0 |
| LE3 | M1/R5 | Y(M1) | 1 | Y(R5) | 0 |
| LE4 | R2 | N | 0 | Y(R2) | 0 |
| LE5 | R4 | N | 0 | Y(R4) | 0 |
| LE6 | M2/R6 | Y(M2) | 1 | Y(R6) | 0 |

FIG. 13

PROGRAMMABLE LOGIC DEVICE INTEGRATED CIRCUITS WITH CONFIGURABLE DYNAMIC PHASE ALIGNMENT CIRCUITRY

This application claims the benefit of provisional patent application No. 60/790,067, filed Apr. 7, 2006, which is hereby incorporated by reference herein in its entirety.

BACKGROUND

This invention relates to integrated circuits such as programmable logic device integrated circuits, and more particularly, to integrated circuits with configurable dynamic phase alignment circuitry.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into a programmable logic device to configure the device to perform the functions of the custom logic circuit.

In a typical system, a programmable logic device integrated circuit and other integrated circuits are mounted on a circuit board. The circuit board contains conductive paths that interconnect the integrated circuits. A system may also have paths that interconnect integrated circuits on different boards. Programmable logic devices contain transceiver circuitry for transmitting and receiving data over these communications paths.

Programmable logic device transceiver circuitry includes input and output drivers. The input and output drivers may use differential signaling schemes in which a pair of signals are referenced to each other or single-ended signaling schemes, in which signals are referenced to ground. In high-speed environments, the input and output drivers are generally differential drivers and handle differential signals.

Some programmable logic device architectures rely extensively on complex hardwired transceiver circuitry. For example, programmable logic devices are available that include transceivers with dynamic phase alignment capabilities. These devices use multiphase clocks. Hardwired dynamic phase alignment circuitry is used to select an optimal clock phase for data capture operations.

While hardwired programmable logic device transceivers with dynamic phase alignment capabilities are appropriate for some logic designs, the inclusion of complex transceiver circuitry of this type is not always desired and can add needless overhead. As a result, other programmable logic device architectures forgo complex transceiver circuitry and only support limited transceiver functionality. Devices of this more limited type have transceivers without dynamic phase alignment capabilities. Although these devices use less hardwired circuitry to capture incoming data, the benefits of dynamic phase alignment are lost.

It would therefore be desirable to be able to provide an integrated circuit such as a programmable logic device integrated circuit with configurable dynamic phase alignment circuitry.

SUMMARY

In accordance with the present invention, programmable logic device integrated circuits are provided that have user-configurable receivers with dynamic phase alignment circuitry. In designs in which dynamic phase alignment capabilities are needed, logic elements can be configured to perform dynamic phase alignment data capture and resynchronization functions. In designs in which dynamic phase alignment capabilities are not needed, resources are made available for implementing other user logic functions.

One or more phase-locked-loop circuits may be used to generate an eight-phase dynamic phase alignment clock signal. A configurable dynamic phase alignment clock distribution architecture is used to distribute the dynamic phase alignment clock signal to dynamic phase alignment circuits in multiple receivers.

Data capture registers are used to capture incoming data. Dynamic phase alignment control circuitry systematically makes measurements during data capture operations while adjusting a clock signal selection multiplexer that selects a given one of the multiple phases of the dynamic phase alignment clock signal. After capturing data using all of the available phases of the dynamic phase alignment clock signal, the dynamic phase alignment control circuitry identifies an optimal phase of the dynamic phase alignment clock to use in capturing data during normal device operation. The dynamic phase alignment control circuit then adjusts the clock selection multiplexer to ensure that normal data capture operations are performed using the optimal clock phase.

Further features of the invention, its nature and various advantages will be more apparent from the accompanying drawings and the following detailed description of the preferred embodiments.

BRIEF DESCRIPTION OF THE DRAWINGS

FIG. 9 is a diagram of an illustrative capture table showing data that may be acquired by the dynamic phase alignment circuitry of FIG. 6 when using a full-rate clock configuration in accordance with the present invention.

FIG. 11 is a diagram of an illustrative capture table showing data that may be acquired by the dynamic phase alignment control circuitry of FIG. 6 when using a half-rate clock configuration in accordance with the present invention.

FIG. 13 is a table showing how components of a dynamic phase alignment circuit are implemented using logic element resources in accordance with the present invention.

DETAILED DESCRIPTION

The present invention relates to integrated circuits containing transceivers with configurable dynamic phase alignment circuitry. The dynamic phase alignment circuitry is formed at least partly from programmable logic. The programmable logic is programmed to perform desired dynamic phase alignment functions using configuration data. With one suitable arrangement, the dynamic phase alignment circuitry is implemented by loading configuration data into volatile memory elements such as random-access-memory (RAM) cells in the integrated circuit.

The integrated circuits used with the present invention may be programmable logic device integrated circuits or programmable integrated circuits that contain programmable circuitry but that are not typically referred to as programmable logic devices. For example, the invention may be used with digital signal processing circuits containing programmable circuitry, microprocessors containing programmable circuitry, application specific integrated circuits containing programmable circuitry, or any other suitable integrated circuit. The present invention will generally be described in the context of programmable logic device integrated circuits as an example.

Figure 1:
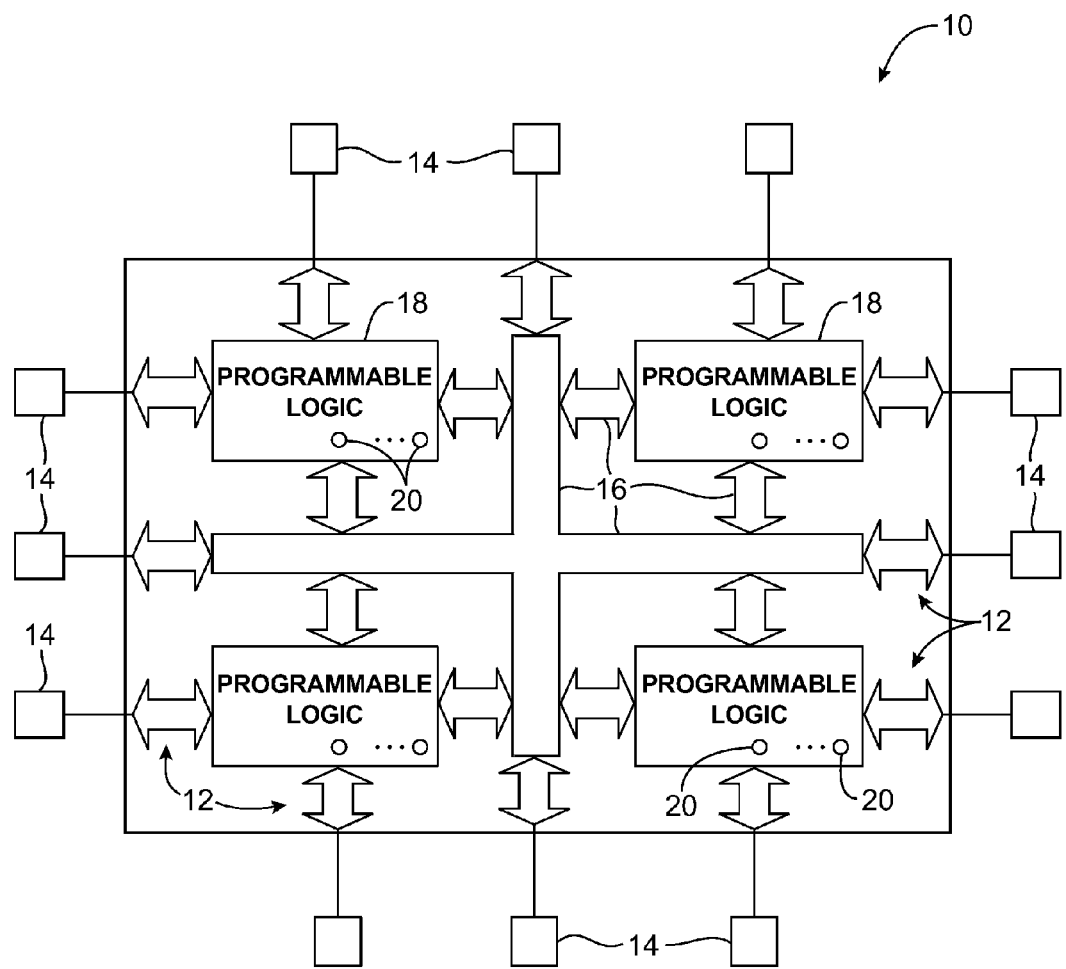
FIG. 1 is a diagram of an illustrative programmable logic device integrated circuit in accordance with the present invention.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with the interconnection resources may be considered to be a part of programmable logic 18.

Programmable logic devices contain programmable elements 20. Some programmable logic devices are programmed by configuring their programmable elements 20 using mask programming arrangements. A mask-programmed device is configured during semiconductor manufacturing. Other programmable logic devices are configured after semiconductor fabrication operations have been completed (e.g., using electrical programming or laser programming to program their programmable elements). In general, programmable elements 20 may be based on any suitable programmable technology, such as fuses, antifuses, electrically-programmable read-only-memory technology, random-access memory cells, mask-programmed elements, etc.

Many programmable logic devices are electrically programmed. With electrical programming arrangements, the programmable elements 20 may be formed from memory cells. During programming, configuration data is loaded into the memory cells using pins 14 and input/output circuitry 12. Memory cells are typically formed from random-access-memory (RAM) cells. Because the RAM cells are loaded with configuration data, they are sometimes referred to as configuration RAM cells (CRAM).

Programmable elements 20 each provide a corresponding static control output signal that controls the state of an associated logic component in programmable logic 18. The output signals are typically applied to the gates of metal-oxide-semiconductor (MOS) transistors.

Figure 2:
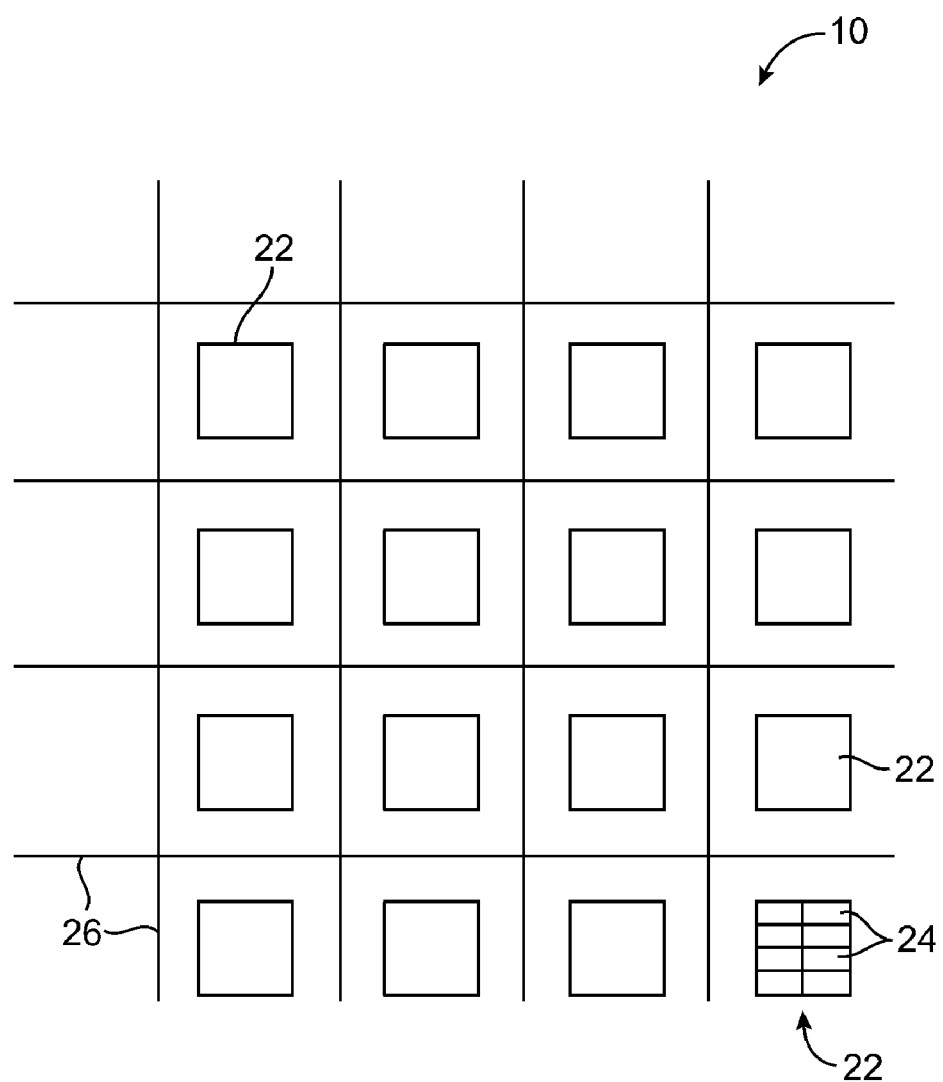
FIG. 2 is a diagram of an illustrative programmable logic device integrated circuit in accordance with the present invention showing how programmable logic may be provided using rows and columns of programmable circuitry.

The circuitry of device 10 may be organized using any suitable architecture. As an example, the logic of programmable logic device 10 may be organized in a series of rows and columns of larger programmable logic regions 22 each of which contains multiple smaller logic regions 24 as shown in FIG. 2. The logic resources of device 10 may be interconnected by interconnection resources such as associated vertical and horizontal conductors 26. Conductors 26 may include global conductive lines that span substantially all of device 10, fractional lines such as half-lines or quarter lines that span part of device 10, staggered lines of a particular length (e.g., sufficient to interconnect several logic areas), smaller local lines that interconnect logic regions 24 with other logic regions 24 in a given region 22, or any other suitable interconnection resource arrangement. If desired, the logic of device 10 may be arranged in more levels or layers in which multiple large regions 22 are interconnected to form still larger portions of logic. Still other device arrangements may use logic that is not arranged in rows and columns.

In some logic devices 10, the larger portions of logic such as logic region 22 may be referred to as "logic array blocks" (LABs) and the smaller portions of logic such as logic regions 24 may be referred to as logic elements (LEs). This is merely one illustrative logic device arrangement 10. For clarity, the present invention will sometimes be described in terms of "logic elements" 24. In general, however, the logic of device 10 may be provided using any suitable programmable logic device architecture.

Figure 3:
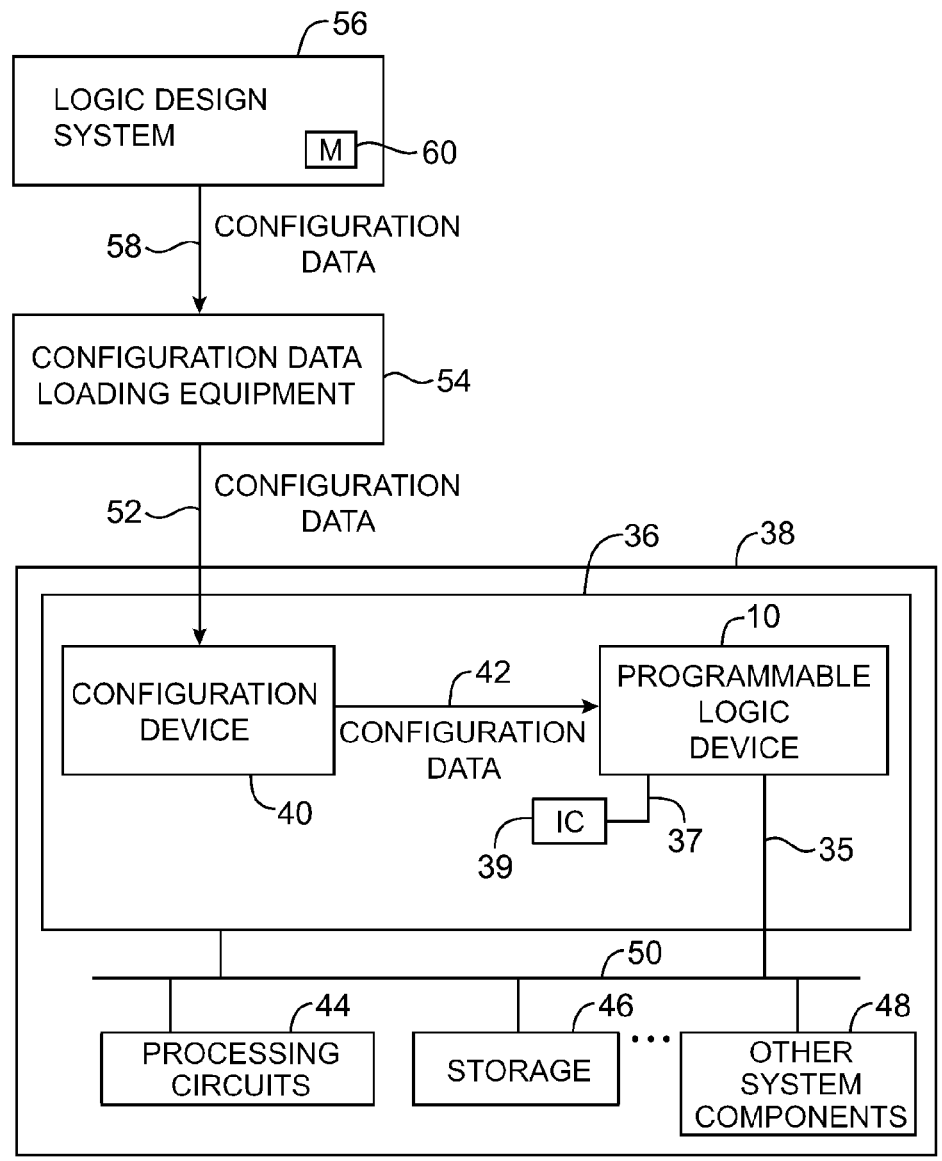
FIG. 3 is a diagram showing how programmable logic device configuration data is created by a logic design system and loaded into a programmable logic device to configure the device for operation in a system in accordance with the present invention.

An illustrative system environment for a programmable logic device 10 is shown in FIG. 3. Programmable logic device 10 may be mounted on a board 36 in a system 38. Programmable logic device 10 may receive configuration data from programming equipment or from any other suitable equipment or device. In the example of FIG. 3, programmable logic device 10 is the type of programmable logic device that receives configuration data from an associated integrated circuit 40. With this type of arrangement, circuit 40 may, if desired, be mounted on the same board 36 as programmable logic device 10. The circuit 40 may be an erasable-programmable read-only memory (EPROM) chip, a programmable logic device configuration data loading chip with built-in memory (sometimes referred to as a configuration device), or any other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings. As shown in the example of FIG. 3, communications paths are used to interconnect device 10 to other components. For example, communications path 37 is used to convey data between an integrated circuit 39 that is mounted on board 36 and programmable logic device 10. Communications paths 35 and 50 are used to convey signals between programmable logic device 10 and components 44, 46, and 48.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 3, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 3.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into the CRAM cells 20 of device 10. Device 10 may then be used in normal operation of system 38.

Figure 4:
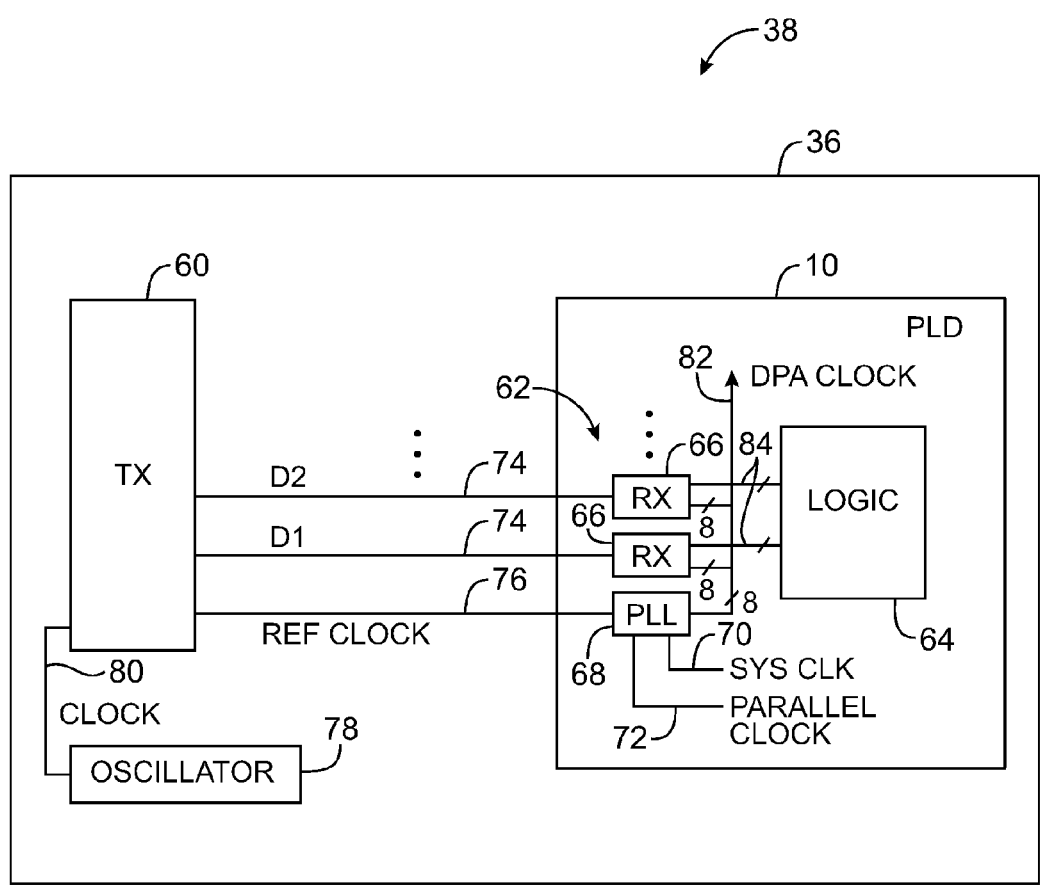
FIG. 4 is a diagram of an illustrative system containing a programmable logic device integrated circuit with transceiver circuitry having configurable dynamic phase alignment circuitry in accordance with the present invention.

During normal operation, data sources such as integrated circuit data sources transmit data to programmable logic device 10 over communications links. An illustrative system 38 in which a transmitter 60 is transmitting data to a programmable logic device 10 is shown in FIG. 4. In the example of FIG. 4, transmitter 60 and programmable logic device 10 are mounted on a circuit board 36. Transmitter 60 may be any suitable source of data such as an integrated circuit. An oscillator transmits clock signals to transmitter 60 over clock path 80.

Transmitter 60 transmits a reference clock signal REF CLK to programmable logic device 10 over reference clock path 76. Corresponding data lines 74 are used to convey data signals such as data signals D1 and D2. Paths such as paths 74 and 76 may be differential paths that contain a pair of conducting lines carrying differential signals. There may be any suitable number of transmitters, data lines, and clocks in a system. The example of FIG. 4 is merely illustrative.

Programmable logic device 10 contains transceiver circuitry 62. Transceiver circuitry 62 contains transmitters for transmitting data to other integrated circuits. Transceiver circuitry 62 also contains receiver circuitry such as receivers 66. Each receiver receives data from a different data path. For example, one receiver 66 receives data signal D1 and another receiver 66 receives data signal D2. The received data is processed by receivers 66 and is provided to logic 64 on parallel data paths 84. Logic 64 may include hardwired logic and user-configured programmable logic.

Phase-locked-loop circuit 68 is used to capture the reference clock. Phase-locked-loop circuit 68 produces a corresponding rate-matched system clock on path 70 (SYS CLK). The system clock in a typical application may have a frequency of about 400 MHz. Phase-locked-loop circuit 68 also produces a parallel clock signals PARALLEL CLOCK on line 72. The signal PARALLEL CLOCK has a slower frequency than the signal SERIAL CLOCK and is suitable for processing the data that has been received from transmitter 60 after serial-to-parallel conversion. In a typical arrangement, the serial data that is transmitted on a communications path 74 has a data rate that is 8-10 times that of the parallel data rate for the same data following serial-to-parallel conversion.

The transceiver circuitry 62 is able to accurately capture data from high-speed data streams transmitted over data paths 74 using a dynamic phase alignment scheme. With dynamic phase alignment techniques, the clock signal that is used to capture incoming data is split into multiple phases. Dynamic phase alignment circuitry in the transceiver circuitry 62 is used to determine which of the multiple clock phases produces the best results when used to capture incoming data.

To support dynamic phase alignment operations, phase-locked-loop circuit 68 produces a multiphase clock signal on path 82. The multiphase clock signal is based on the received reference clock 76. Because the multiphase clock signal is used by dynamic phase alignment circuitry on programmable logic device 10, the multiphase clock signal is sometimes referred to as a dynamic phase alignment (DPA) clock. In general, any suitable number of phases may be used in the DPA clock. For example, the DPA clock may have eight phases (DPA0, DPA1, . . . DPA7). If desired, the DPA clock may have fewer phase or more phases. Schemes with fewer clock phases are less accurate, but are less difficult to implement. Schemes with more clock phases require additional circuitry and tighter tolerances, but provide more accuracy.

As shown in FIG. 4, the multiphase DPA CLOCK signal is distributed to multiple receivers 66 from phase-locked-loop circuit 68 using path 82. Path 82 is a bus (sometimes called a clock tree) that contains individual lines for carrying each of the phases of the DPA clock. In the example of FIG. 4, the DPA clock has eight phases, so path 82 is a bus containing eight parallel lines.

Figure 5:
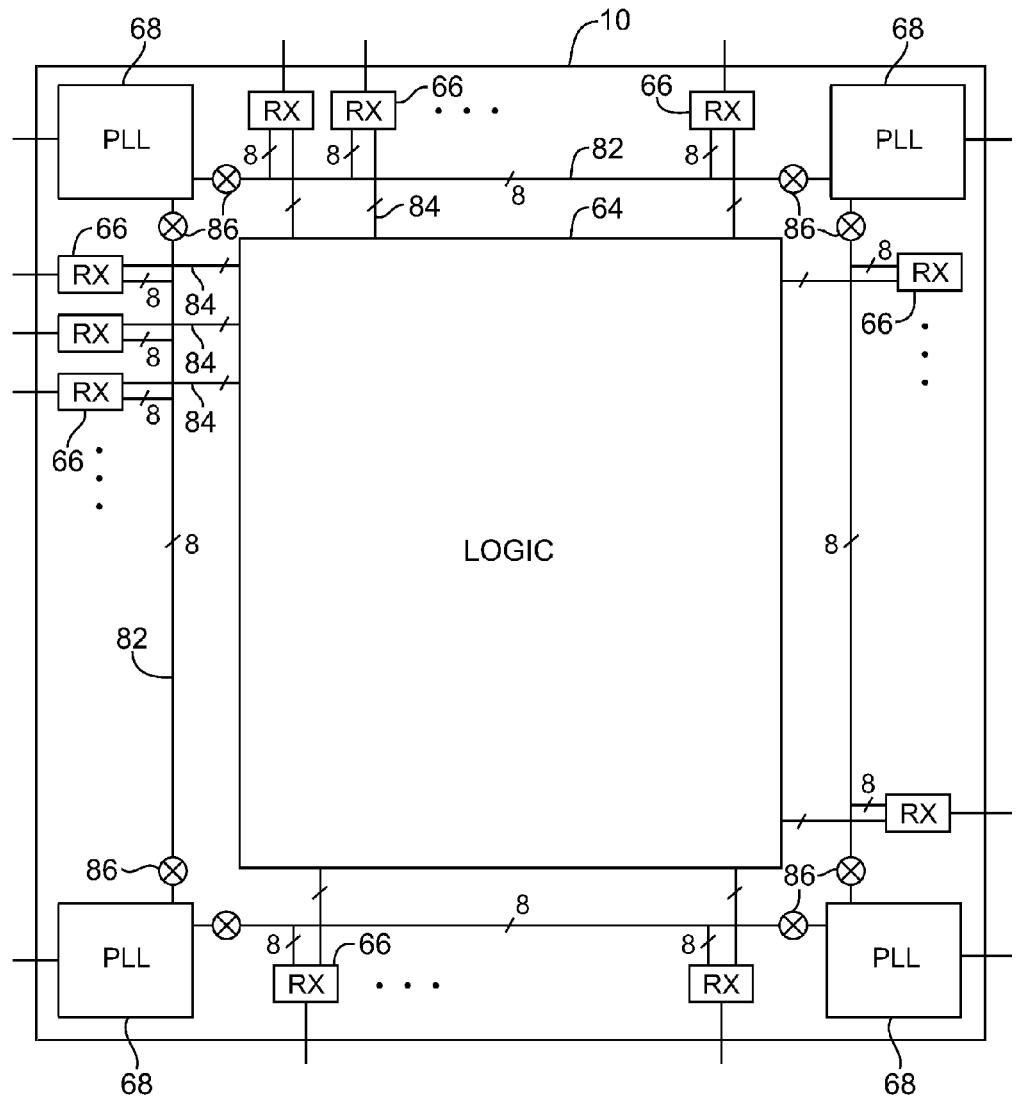
FIG. 5 is a diagram of an illustrative programmable logic device integrated circuit with configurable dynamic phase alignment circuitry in accordance with the present invention.

There may be any suitable number of phase-locked-loop circuits 68 and receivers 66 on a programmable logic device integrated circuit. A typical device architecture is shown in FIG. 5. In the example of FIG. 5, programmable logic device 10 contains four phase-locked-loop circuits 68. Each phase-locked-loop circuit 68 is located in a different one of the four corners of the programmable logic device integrated circuit 10. One, two, three, or all four of the phase-locked-loop circuits 68 may be used to lock onto an incoming reference clock signal and provide a corresponding multiphase DPA clock signal. Switches 86 are used to selectively route the multiphase DPA clock output of the appropriate phase-locked-loop circuitry onto desired paths 82. Switches 86 may be controlled by the static output signals of programmable elements 20 on device 10 or by dynamic control signals.

By configuring switches 86, a user can select which dynamic phase alignment clock signals are driven onto paths 82. For example, if one phase-locked-loop circuit 68 is used to generate the dynamic phase alignment clock signal, the switches 86 can be configured so that this single multiphase dynamic phase alignment clock signal is routed to the dynamic phase alignment clock distribution paths 82 on all four edges of programmable logic device integrated circuit 10. If, as another example, two phase-locked-loop circuits 68 are used to generate dynamic phase alignment clock signals, the switches 86 can be used to route the dynamic phase alignment clock signals from one circuit 68 to the topmost and right-hand paths 82 and to route the dynamic phase alignment clock signals from the other circuit 68 to the lowermost and left-hand paths 82. These are merely illustrative examples. In general, the switches 86 can be configured to route the dynamic phase alignment clock signals on paths 82 in any suitable arrangement.

The dynamic phase alignment clock signals from a single phase-locked-loop circuit 68 are typically distributed to multiple receivers 66, so phase-locked-loop circuitry 68 need not be needlessly duplicated on circuit 10. There may be any suitable number of receivers 66 in a given programmable logic device integrated circuit 10. As an example, each of the four sides of the programmable logic device integrated circuit 10 may have from 20-30 separate receivers 66 each of which receives serial data signals from a corresponding data path 74 (FIG. 4).

Figure 6:
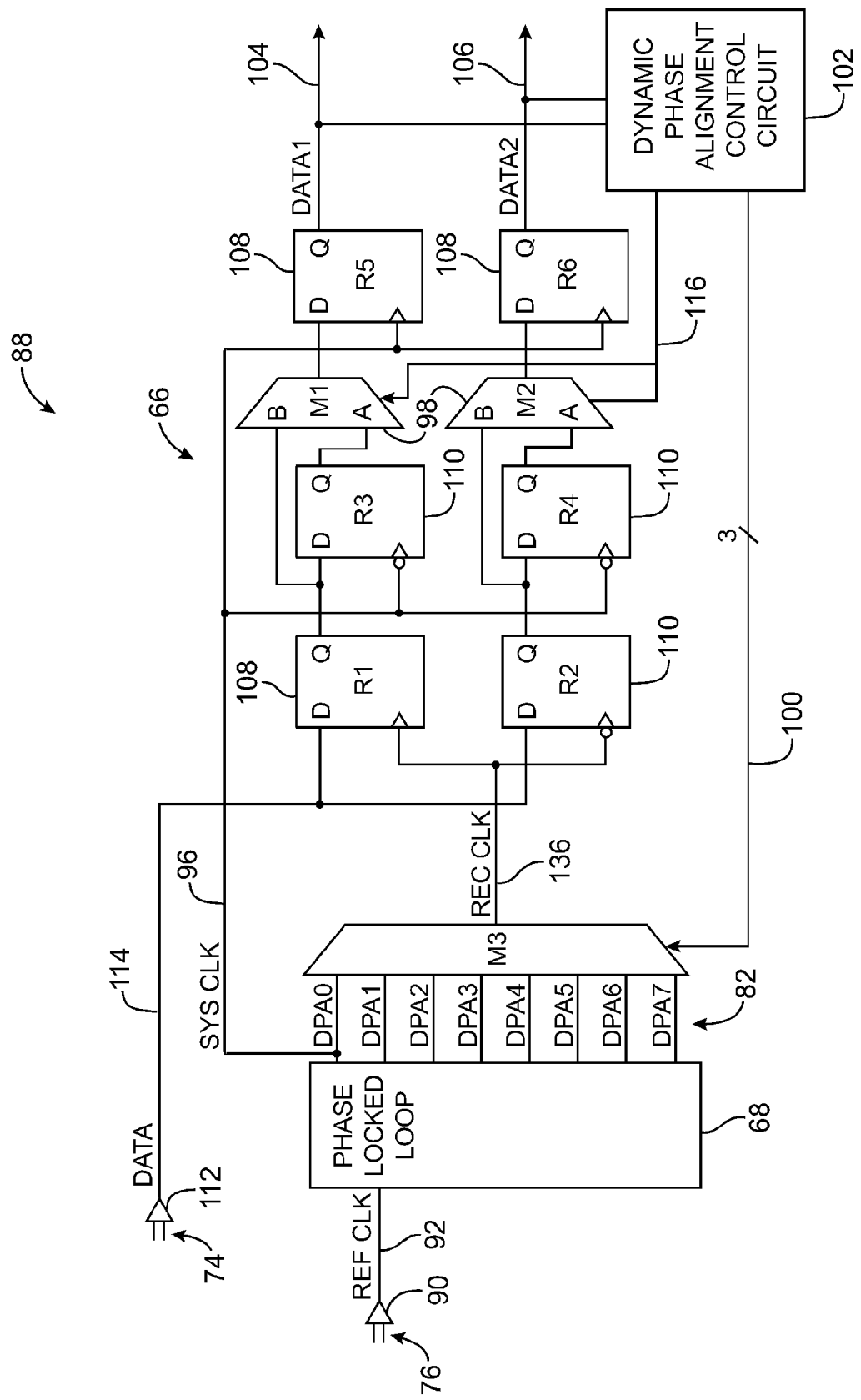
FIG. 6 is a diagram of an illustrative dynamic phase alignment circuit in a programmable logic device integrated circuit transceiver in accordance with the present invention.

Illustrative phase-locked-loop circuitry and receiver circuitry 88 is shown in FIG. 6. Circuitry 88 includes a phase-locked-loop circuit 68 and dynamic phase alignment receiver circuitry 66 (sometimes referred to as dynamic phase alignment circuitry). A reference clock signal is received from a transmitter via path 76. Differential-to-single-ended buffer 90 generates a corresponding single-ended reference clock signal REF CLK on path 92. Phase-locked-loop circuit 68 locks onto the reference clock signal REF CLK on path 92 and produces a corresponding multiphase dynamic phase alignment clock signal on output lines 82. The eight phases of the dynamic phase alignment clock signals are labeled DPA0, DPA1, DPA2, . . . DPA7 and each phase is shifted by one-eighth of a reference clock cycle with respect to the next. The first phase of the dynamic phase alignment clock DPA0 forms a system clock signal SYS CLK, which is routed to circuitry 66 via path 96.

Dynamic phase alignment clock selection multiplexer M3 receives the eight-phase dynamic phase alignment clock signals on the eight corresponding lines of path 82. Multiplexer M3 connects one of its eight inputs to its output. The setting of multiplexer M3 is controlled by a multibit control signal received from dynamic phase alignment control circuit 102 over path 100.

During training (set up) operations, the dynamic phase alignment control circuit 102 varies the setting of multiplexer M3, so that different selected phases of the dynamic phase alignment clock signal are presented at the output of multiplexer M3. The dynamic phase alignment control circuit 102 evaluates the success of data capture operations for each setting. After identifying an optimal one of the eight phases of the dynamic phase alignment clock signal, dynamic phase alignment control circuit 102 adjusts the multiplexer M3 so that the optimal phase of the dynamic phase alignment clock is provided at the output 136 of the multiplexer. The device 10 may then be operated normally. The optimal phase is sometimes referred to as the recovered clock signal REC CLK.

Circuit 66 receives incoming data from a corresponding communications path 74. Differential-to-single-ended buffer 112 generates a corresponding single-ended data signal DATA on path 114. Incoming data is typically encoded using a double-date-rate scheme. During processing by circuitry 66, the incoming double-data-rate signal DATA is converted into two corresponding data streams DATA1 and DATA2 on lines 104 and 106. The signals DATA1 and DATA2 are provided to logic 64 (FIGS. 4 and 5) for deserialization and further processing.

The data signal DATA on path 114 is processed using registers 108 and 110 (labeled R1, R2, R3, R4, R5, and R6) and multiplexers 98 (labeled M1 and M2). Registers 108 have non-inverting clock inputs and capture data on rising clock edges. Registers 110 have inverting clock inputs and capture data on falling clock edges. Multiplexers 98 are used to selectively bypass register R3 and R4.

Registers R1 and R2 are data capture registers. Data capture registers R1 and R2 are clocked by the selected phase of the dynamic phase alignment clock signal at the output of multiplexer M3. During each rising clock edge, a bit of the data signal DATA on line 114 is captured by register R1. During each falling clock edge, a bit of the data signal DATA on line 114 is captured in register R2.

Registers R3, R4, R5, and R6 and multiplexers M1 and M2 serve as resynchronization circuitry that converts the data flowing through registers R1 and R2 from the REC CLK clock domain to the SYS CLK clock domain. The recovered clock REC CLK is used to capture the incoming data stream DATA into registers R1 and R2. Registers R3, R4, R5, and R6 and multiplexers M1 and M2 ensure that the captured data can be used by logic 64. Logic 64 uses clock signals SYS CLK (prior to deserialization) and PARALLEL CLOCK (following deserialization). Signals SYS CLK and PARALLEL CLOCK are phase-aligned with each other, but are not phase aligned with the recovered clock signal REC CLK. Accordingly, the resynchronization circuitry formed from registers R3, R4, R5, and R6 and multiplexers M1 and M2 is used to convert between clock domains.

Double-data-rate (DDR) data can be captured using a full-rate clock scheme or a half-rate clock scheme. A user of programmable logic device 10 can configure circuitry 88 to perform full-rate capture operations or half-rate capture operations as desired.

Figure 7:
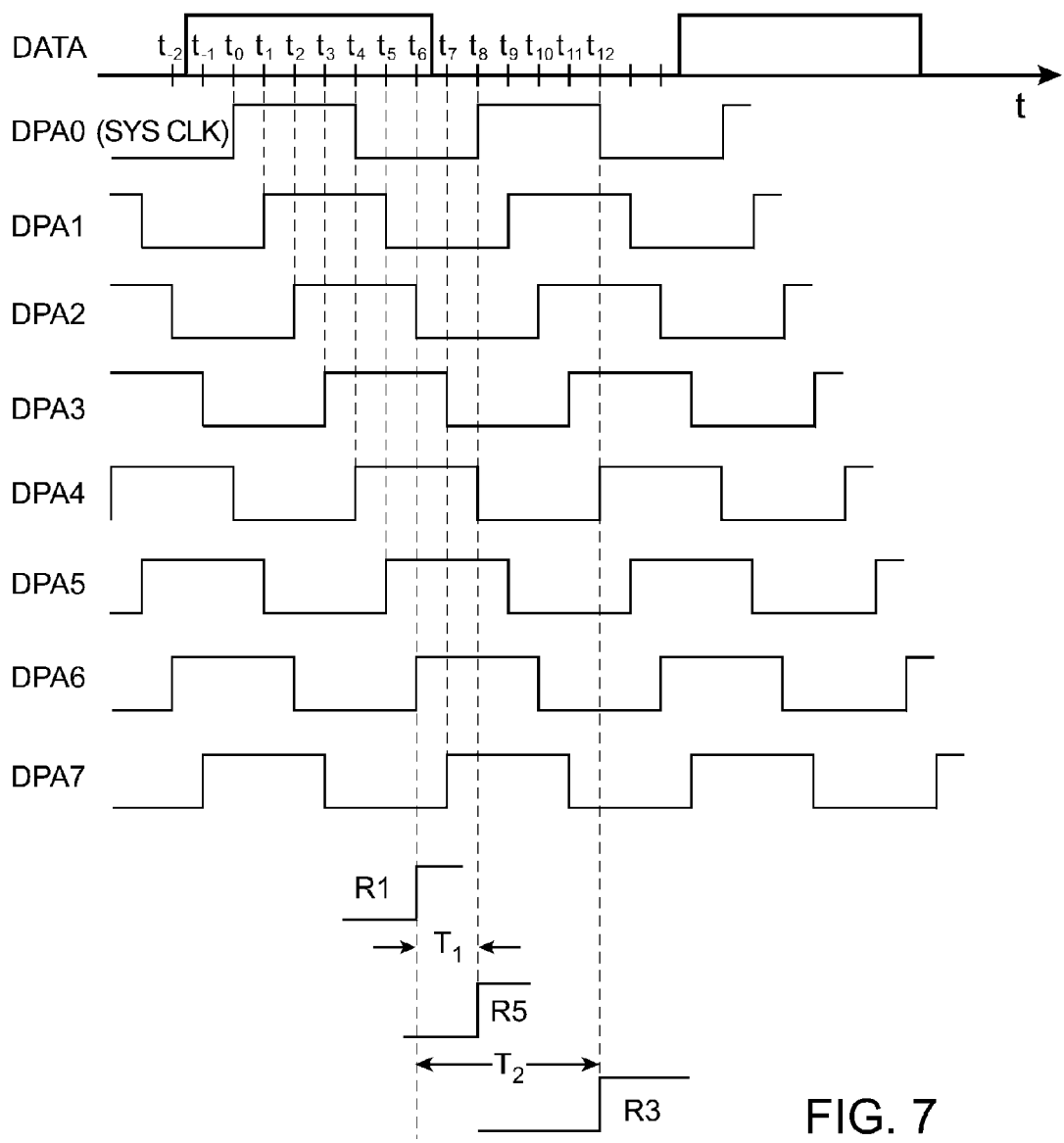
FIG. 7 is a timing diagram of clock and data signals in a programmable logic device integrated circuit with configurable dynamic phase alignment circuitry using a full-rate clock configuration in accordance with the present invention.

A timing diagram showing data and clock signals in a full-rate clock scheme is shown in FIG. 7. As shown in FIG. 7, each of the dynamic phase alignment clock phases DPA0, DPA1, DPA2, . . . DPA7 is shifted by one-eighth of a clock cycle with respect to the next. For example, clock signals DPA2 and DPA3 are shifted by one-eighth of a clock cycle. Times $t_i$ correspond to the edges of the dynamic phase alignment clock signals. The rising edge of dynamic phase alignment clock signal DPA0 (which is also the system clock signal SYS CLK) occurs at time $t_0$, the rising edge of dynamic phase alignment clock signal DPA1 occurs at time $t_1$, the rising edge of dynamic phase alignment clock signal DPA2 occurs at time $t_2$, the rising edge of dynamic phase alignment clock signal DPA3 occurs at time $t_3$, the rising edge of dynamic phase alignment clock signal DPA4 occurs at time $t_4$, etc.

During training, a training sequence is transmitted to programmable logic device integrated circuit 10 from the transmitter 60. A typical training sequence is composed of alternating ones and zeros, as shown in the example of FIG. 7. As the training sequence is received on line 114 as signal DATA, the dynamic phase alignment control circuit 102 systematically captures data using each of the phases of the dynamic phase alignment clock. The results of these testing operations are processed to locate the edges of the data signal. In the example of FIG. 7, there is a DATA signal edge located between times $t_6$ and $t_7$. Once the edges of the data signal have been located, the dynamic phase alignment control circuit 102 determines the optimal phase of the clock that is to be used as the recovered clock signal REC CLK. The optimal phase has its edges aligned with the centers of the DATA pulses.

The dynamic phase alignment control circuit 102 controls multiplexers M1 and M2 via control paths 116. The multiplexers M1 and M2 can be operated with either their "A" inputs or their "B" inputs connected to their outputs. With one suitable arrangement, testing starts with the "B" inputs of multiplexers M1 and M2 connected to their outputs. When it is determined that the rising edge of the currently selected dynamic phase alignment clock phase falls within a predetermined range of the rising edge of the system clock SYS CLK, the dynamic phase alignment control circuit 102 issues multiplexer control signals on path 116 to switch the "A" inputs of multiplexers M1 and M2 to their outputs. This ensures that the registers of circuitry 66 will have sufficient timing margins to operate properly.

Consider, as an example, the potential capture of the signal DATA at time $t_6$. Multiplexer M3 is adjusted so that the dynamic phase alignment signal DPA6 is routed to the clock input of register R1. At time $t_6$, the leading edge of signal DPA6 goes high. As shown in the third-to-last trace in FIG. 7, this causes the value of DATA to be captured by register R1. With the output Q of register R1 valid (at a logic one value in this example), either register R3 or register R5 will be used to convert this signal to the SYS CLK clock domain. Dynamic phase alignment control circuit 102 selects whether resynchronization register R3 or resynchronization register R5 is switched into use.

If the "B" input of multiplexer M1 is connected to its output, resynchronization register R3 is bypassed and the data signal Q at the output of register R1 is captured by register R5. Register R5 has a noninverting clock input, so register R5 captures data at its input on the rising edge of the system clock signal SYS CLK, as shown in the second-to-last trace of FIG. 7.

If, however, the "A" input of multiplexer M1 is connected to its output, resynchronization register R3 is switched into use by dynamic phase alignment control circuit 102. In this situation, the data signal Q at the output of register R1 is captured by register R3. Register R3 has an inverted clock input, so register R3 captures data on the falling edge of system clock signal SYS CLK, as shown in the last trace of FIG. 7.

As this example demonstrates, the two different resynchronization registers R3 and R5 exhibit significantly different timing margins. When R5 is switched into use, there is a time $T_1$ of only two eighths of a clock cycle (i.e., $T_1 = t_8 - t_6$) between when the data captured in R1 becomes valid and the rising edge of the SYS CLK signal that triggers R5. When R3 is switched into use, there is a time $T_2$ of six eighths of a clock cycle (i.e., $T_2 = t_{12} - t_6$) between the time at which the output of R1 becomes valid and the time at which the signal at the input of R3 is captured. The data that is captured by register R1 at time $t_6$ will therefore be resynchronized most reliably if resynchronization register R3 is used.

Dynamic phase alignment circuit 102 adjusts the multiplexer M1 to ensure a sufficient setup time for the resynchronization register. Any suitable criteria may be used to determine when to switch the multiplexer M1. With one suitable approach, the multiplexer M1 is switched whenever necessary to avoid a setup time less than two eighths of a clock cycle or any other suitable predetermined threshold value. In the present example, the separation $T_1$ between the rising edge of the selected dynamic phase alignment clock phase DPA6 and the rising edge of SYS CLK would be two-eighths of a clock cycle if register R5 were to be used. Because this value is too small, the dynamic phase alignment circuit 102 adjusts multiplexer M1 to connect its "A" input to its output. This switches resynchronization register R3 into use and ensures sufficient time ($T_2$) for resynchronization register R3 to capture the data from data capture register R1.

Although this example involved the use of registers R1, R3, and R5 and multiplexer M1, the same timing margin concerns apply to registers R2, R4, and R6 and multiplexer M2. Dynamic phase alignment control circuit 102 switches both multiplexer M1 and multiplexer M2 as needed to ensure that the resynchronization registers have sufficient margin to operate satisfactorily.

Figure 8:
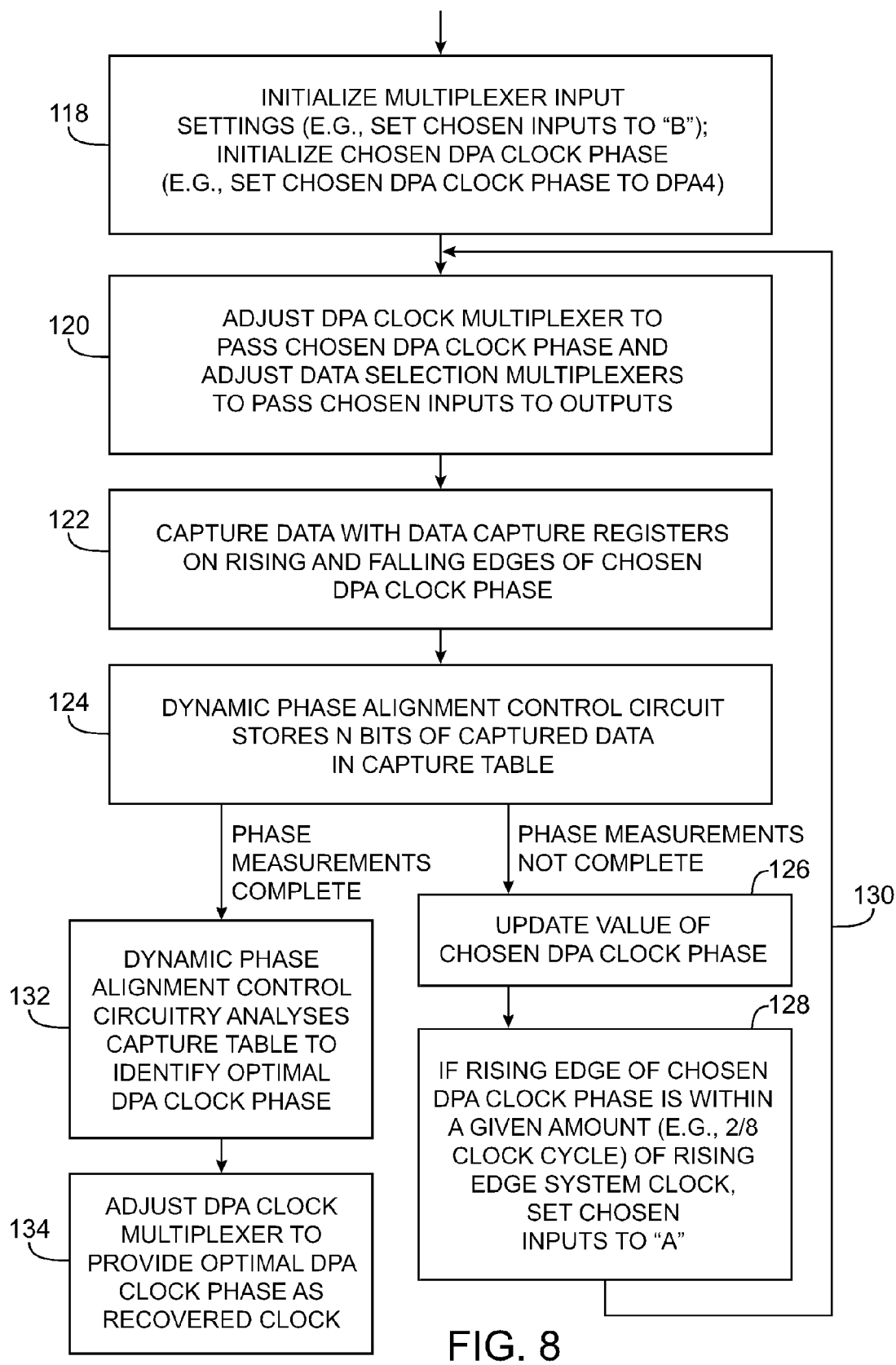
FIG. 8 is a flow chart of illustrative steps involved in setting up and operating dynamic phase alignment circuitry in a programmable logic device integrated circuit in accordance with the present invention.

Illustrative steps involved in using the circuitry 88 of FIG. 6 to process incoming data are shown in FIG. 8.

At step 118, dynamic phase alignment control circuit 102 performs initialization operations. Dynamic phase alignment control circuit 102 implements a control state machine. The circuitry of dynamic phase alignment control circuit 102 is preferably implemented using programmable logic 18 (FIG. 1). Control parameters that are used by the control circuit state machine include a parameter CHOSEN INPUTS that specifies the input settings for multiplexers M1 and M2 of FIG. 6 and a parameter CHOSEN DPA CLOCK PHASE that specifies the setting for dynamic phase alignment clock phase selection multiplexer M3. During initialization, the values of CHOSEN INPUTS and CHOSEN DPA CLOCK PHASE are set to appropriate initial values. With one suitable approach, CHOSEN INPUTS is set to "B" and CHOSEN DPA CLOCK PHASE is set to DPA4.

At step 120, the dynamic phase alignment control circuit 102 adjusts the dynamic phase alignment clock phase selection multiplexer M3 so that the chosen phase of the clock is passed to line 136. For example, if the current value of CHOSEN DPA CLOCK PHASE is DPA4, dynamic phase alignment control circuit 102 adjusts multiplexer M3 so that the signal DPA4 is routed to line 136. The dynamic phase alignment control circuit 102 also adjusts the multiplexers M1 and M2 according to the value of CHOSEN INPUTS. For example, if the value of CHOSEN INPUTS is "B," the dynamic phase alignment control circuit 102 adjusts multiplexers M1 and M2 so that their "B," inputs are connected to their respective outputs. After the adjustments of step 120, either a first set of resynchronization registers (R3, R4, R5, and R6) is switched into use or a second set of resynchronization registers (R5 and R6) is switched into use.

At step 122, the data signal DATA on line 114 is captured using capture registers R1 and R2. During step 122, the DATA signal transmitted from transmitter 60 is a training pattern (e.g., alternating ones and zeros). Register R1 has a noninverting clock input, so register R1 captures the signal DATA on the rising edges of the chosen dynamic phase alignment clock. Register R3 has an inverting clock input, so register R3 captures the signal DATA on the falling edges of the chosen dynamic phase alignment clock. As data is captured with the data capture registers, the resynchronization registers perform clock domain conversion. During clock domain conversion, the set of resynchronization registers that has been switched into use is used to change the clock domain of the captured data from the CHOSEN DPA CLOCK PHASE domain to the SYS CLK domain. The resulting captured output data is provided on lines 104 and 106 as data signals DATA1 and DATA2.

Dynamic phase alignment control circuit 102 monitors the captured data corresponding to the currently active dynamic phase alignment clock phase and stores these signals for processing at step 124. In the present example, the dynamic phase alignment control circuitry 102 monitors the DATA1 signal on line 104 and stores this data. Any suitable arrangement may be used to store the captured data signals. With one suitable approach, the captured signals may be stored in volatile memory on programmable logic device integrated circuit 10 in the form of a capture table of the type shown in FIG. 9.

As shown in FIG. 9, capture table 138 contains rows and columns. Each row of the capture table 138 contains entries corresponding to a different value of the chosen dynamic phase alignment clock signal. For example, the first row of table 138 contains entries corresponding to the clock phase DPA0, the second row of table 138 contains entries corresponding to the clock phase DPA1, the third row of table 138 contains entries corresponding to the clock phase DPA2, etc. Each time M3 is adjusted, a different set of N bits of the DATA1 signal is measured. Any suitable number of bits N may be measured per clock phase. In the example of FIG. 9, the value of N is 10, so ten clock cycles worth of DATA1 measurements have been acquired and stored in each row of the capture table 138 of FIG. 9.

At step 126, if a complete set of eight phase measurements has not yet been made, the value of CHOSEN DPA CLOCK PHASE is updated. The value of CHOSEN DPA CLOCK PHASE is incremented if CHOSEN DPA CLOCK PHASE is less than DPA7. If the value of CHOSEN DPA CLOCK PHASE is DPA7, updating is performed by setting CHOSEN DPA CLOCK PHASE to DPA0 (i.e., by looping back from the last row to the first row of the capture table).

At step 128, the value of CHOSEN INPUTS is updated if necessary to ensure proper timing margins are maintained in the resynchronization registers. As described in connection with FIG. 7, if the edge of the CHOSEN DPA CLOCK PHASE is within less than 2/8 clock cycles of SYS CLK (or other suitable predetermined amount), there will not be a sufficient setup time for the resynchronization registers. Accordingly, if needed to maintain adequate separation between the rising edge of the CHOSEN DPA CLOCK PHASE clock signal and the SYS CLK clock signal, the value of CHOSEN INPUTS is switched (i.e., from "A" to "B" or "B" to "A"). As shown in the capture table example of FIG. 9, this transition occurs twice—once between clock phases DPA4 and DPA5 and once between clock phases DPA0 and DPA1.

After measurements have been made using all eight dynamic phase alignment clock phases, the dynamic phase alignment control circuitry 102 analyzes the results stored in the data capture table (step 132).

The captured data signals in the capture table reveal the time positions of the DATA signal edges. If a given value of CHOSEN DPA CLOCK PHASE produces clean captured data, the dynamic phase alignment control circuit 102 can conclude that the given value of CHOSEN DPA CLOCK PHASE is not at a DATA signal edge. Captured data that is not clean indicates the presence of an edge.

For example, consider the data of the capture table 138 of FIG. 9, which corresponds to various dynamic phase alignment clock phase measurements made on the illustrative DATA training sequence shown in FIG. 7. The row of table 138 corresponding to clock phase DPA4 indicates that the dynamic phase alignment control circuit 102 measured ten ones and no zeros when monitoring line 104 while the multiplexer M3 was adjusted to deliver the DPA4 clock phase on line 136. This data is clean, because all of the measured data bits have the same value (i.e., all of the captured bits are ones). The row of table 138 corresponding to clock phase DPA5 indicates that the data captured using clock phase DPA5 is also clean. In contrast, the row of table 138 corresponding to clock phase DPA6 indicates that the dynamic phase alignment control circuit 102 measured three zeros and seven ones when monitoring line 104 while the multiplexer M3 was adjusted to deliver the DPA6 clock phase on line 136. Because different amounts of ones and zeros were captured, the dynamic phase alignment control circuit 102 can conclude that the edge of the DPA6 clock phase is near to the data edge for the signal DATA.

The proximity of the edge of DPA6 to the edge of DATA is illustrated in FIG. 7. As shown in FIG. 7, the signal DPA6 rises at time $t_6$. The signal DATA during training includes a training pattern of alternating ones and zeros. As shown in the uppermost trace of FIG. 7, the value of DATA is a logic one from a point in time midway between times $t_2$ and $t_{-1}$ to a time midway between times $t_6$ and $t_7$ and then is a logic zero. This pattern then repeats. The edge of DPA6 is therefore in the proximity of the falling edge of the DATA signal. Due to noise in the system, the value of the data bits captured using clock phase DPA6 are not all the same. Sometimes a logic one is captured, as expected from the position of DPA6 within the positive DATA pulse shown in FIG. 7. Other times, however, a logic zero is captured due to noise. The captured data when clock phase DPA6 is used is therefore mixed (some ones and some zeros), as indicated by the row of the data capture table 138 corresponding to the clock phase DPA6.

During the analysis of step 132, the dynamic phase alignment control circuit 102 determines which clock phases resulted in clean measurements and which clock phases resulted in noisy measurements. Because noisy measurement correspond to data edges, the dynamic phase alignment control circuit 102 can determine the optimal clock phase for capturing data by identifying the midpoint between the data edges. In the example of FIGS. 7, 8, and 9, the dynamic phase alignment control circuit 102 selects the clock phase DPA3 as the optimal clock phase to use in capturing data.

If desired, the dynamic phase alignment control circuit 102 can take into account the amount of noise measured for each clock phase. For example, a measurement of one zero and nine ones is less noisy (and therefore farther from the data edge) than a measurement of five zeros and five ones. Using information on the amount of noise in the captured data for each phase, the dynamic phase alignment control circuit 102 can identify the optimal dynamic phase alignment clock phase with enhanced accuracy.

After the optimal dynamic phase alignment clock phase has been identified at step 132, the dynamic phase alignment control circuit 102 adjusts multiplexer M3 so that the optimal dynamic phase alignment clock phase (DPA3 in this example) is provided to line 136 as the recovered clock signal REC CLK. The programmable logic device integrated circuit 10 may then receive transmitted data normally using the circuitry of FIG. 6.

Figure 10:
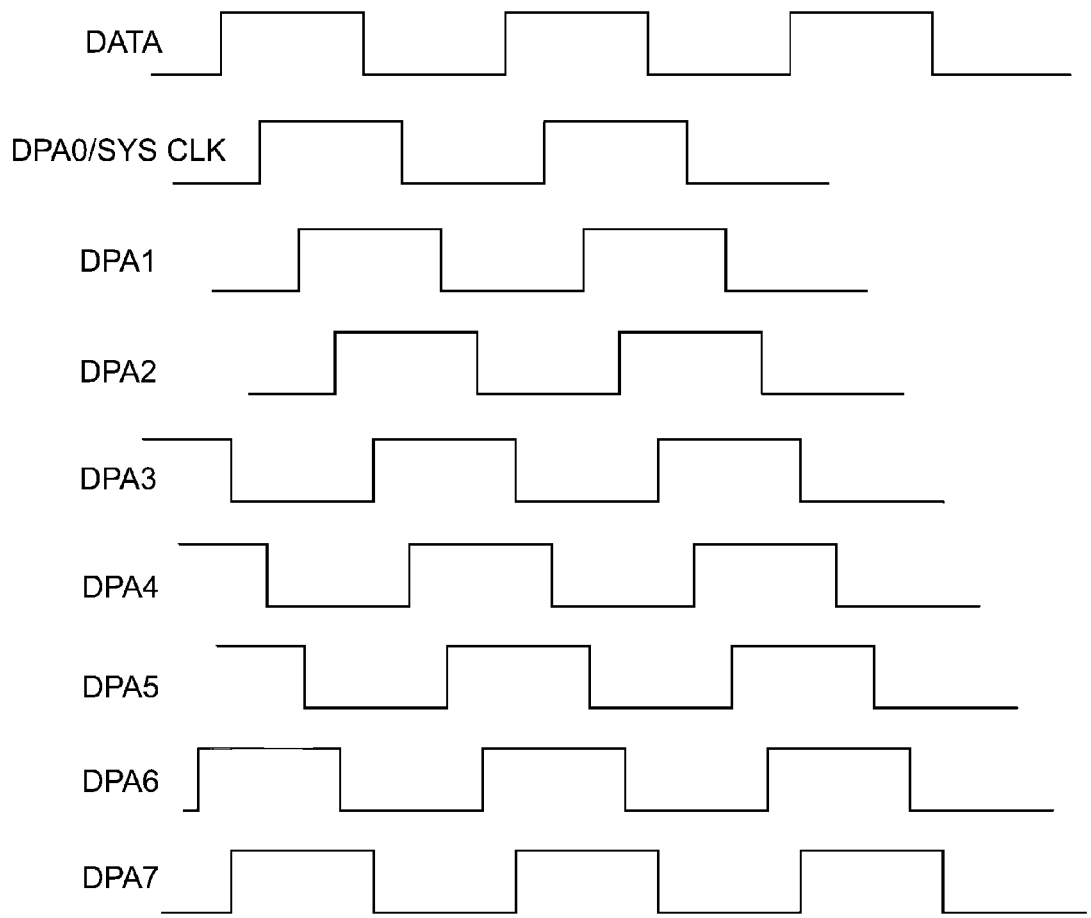
FIG. 10 is a timing diagram of clock and data signals in a programmable logic device integrated circuit diagram with configurable dynamic phase alignment circuitry using a half-rate clock configuration in accordance with the present invention.

If desired, the dynamic phase alignment circuitry of FIG. 6 may be used in a half-rate clock configuration. This type of approach is illustrated by the timing diagram of FIG. 10 and the corresponding data capture table of FIG. 11. As shown in FIG. 10, in a half-rate configuration the rate of the dynamic phase alignment clock signals is half of the rate of the dynamic phase alignment clock signals in the full-rate configuration of FIGS. 7 and 8. In a full-rate configuration, the separation between clock phases is smaller, so there is more accuracy. However, because the phase-to-phase time spacing is smaller, timing becomes more critical. With a half-rate configuration, timing requirements are relaxed.

As shown in the illustrative data capture table 140 of FIG. 11, dynamic phase alignment control circuit 102 monitors data signals DATA1 and DATA2 during training (step 124 of FIG. 8), rather than measuring only data signal DATA1. During analysis of the captured data (step 132 of FIG. 8), the dynamic phase alignment control circuitry 102 uses information on both the number of ones and zeros captured in the DATA1 signal and the number of ones and zeros captured in the DATA2 signal in determining whether the captured data is clean or noisy. By using the noisy measurements as indicators of the location of the data edges, the dynamic phase alignment control circuitry 102 identifies the optimal dynamic phase alignment clock phase to use as the recovered clock signal REC CLK.

The circuitry of FIG. 6 may be implemented using any suitable combination of hard and soft logic. With one particularly suitable arrangement some of circuitry 88 is implemented using programmable logic 18 and some of circuitry 88 is implemented using hardwired logic.

Components in circuitry 88 that are preferably implemented using hardwired circuitry include phase-locked-loop 68, differential-to-single-ended input buffers 112 and 90, and multiplexer M3. The use of hardwired circuitry to implement these components helps to minimize the amount of on-chip real estate and programmable resources that are consumed in implementing the dynamic phase alignment logic and helps to ensure that desired levels of timing performance are obtained.

Components of circuitry 88 that are preferably implemented using programmable logic include the data capture registers R1 and R2, resynchronization registers R3, R4, R5, and R6, multiplexers M1 and M2, and dynamic phase alignment control circuitry 102. Dynamic phase alignment control circuitry 102 may be implemented from general purpose programmable logic resources such as a group of tens or hundreds of logic elements 24 (FIG. 2). With one suitable arrangement, data capture registers R1 and R2, resynchronization registers R3, R4, R5, and R6, and multiplexers M1 and M2, can be implemented from six logic elements 24.

Figure 12:
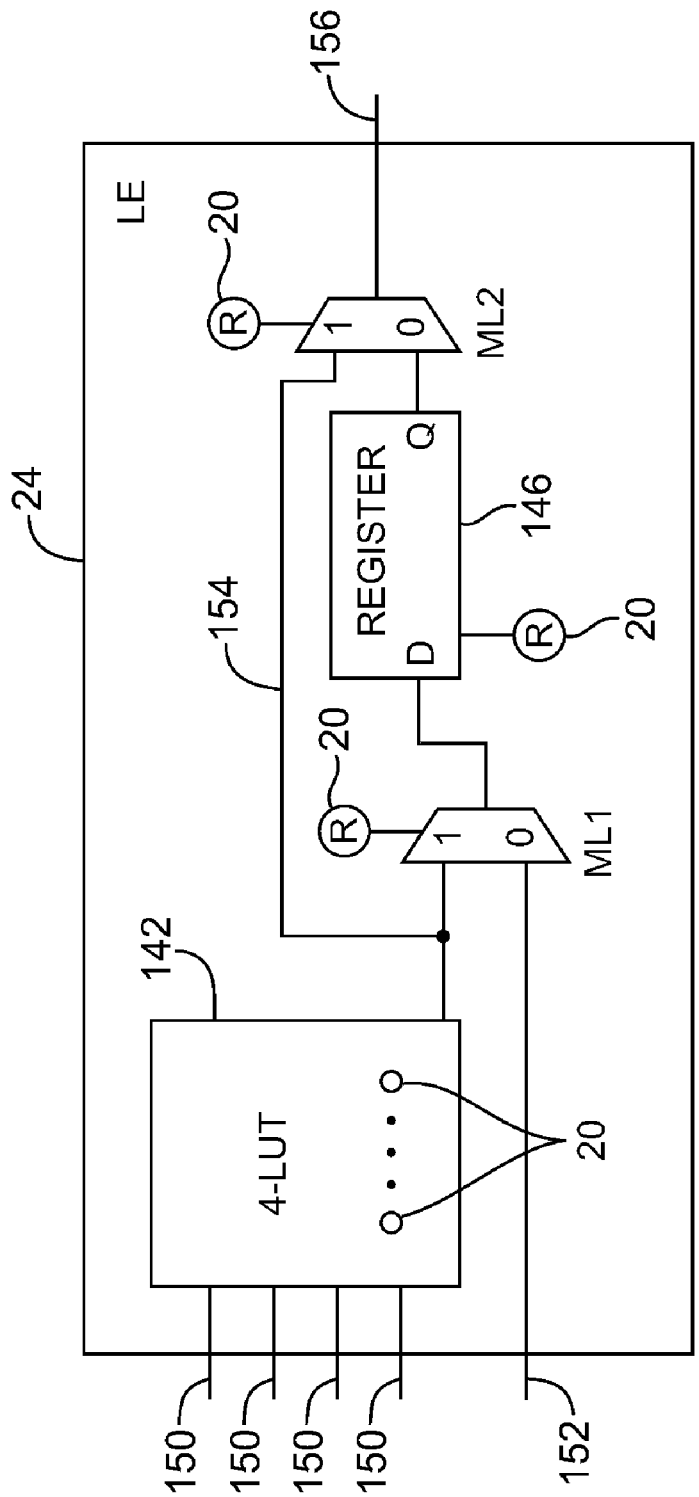
FIG. 12 is a diagram showing illustrative resources in a logic element that may be used in configuring programmable logic on a programmable logic device integrated circuit to implement a receiver with dynamic phase alignment circuitry in accordance with the present invention.

An illustrative logic element 24 is shown in FIG. 12. As shown in FIG. 12, logic element 24 contains a four-input look-up table (4-LUT) 142. During programming of programmable logic device integrated circuit 10, configuration data is loaded into the programmable elements 20 of look-up table 142 to configure the look-up table 142. Look-up table 142 can be configured to perform any desired combinatorial logic function on its four inputs 150. The output of look-up table 154 is routed to the "1" input of multiplexer ML1. The "0" input of multiplexer ML1 receives input from logic element input line 152. A programmable element 20 is used to control which of the two inputs to multiplexer ML1 is connected to its output. The output of multiplexer ML1 is routed to the data (D) input of register 146. Multiplexer ML2 has two inputs. The "0" input of multiplexer ML2 is connected to the data output (Q) of register 146. The "1" input of multiplexer ML2 is connected to register bypass path 154. A programmable element 20 is used to control the setting of multiplexer ML2. Register 146 can be configured to operate in positive-edge-triggered mode or in negative-edge-triggered mode by loading appropriate configuration data into an associated programmable element 20.

The table of FIG. 13 shows how six logic elements (LE1, LE2, LE3, LE4, LE5, and LE6) can be configured by a user to implement the circuitry of FIG. 6. Each row in table 158 corresponds to one of the logic elements, as indicated in the first column of table 158. For example, the first row of table 158 corresponds to the first logic element, LE1.

The second column of table 158 indicates which circuit resource in FIG. 6 is implemented using each logic element. For example, the entry "R1" in the first row of the second column of table 158 indicates that the register R1 of FIG. 6 can be implemented using the logic element LE1 and the entry "R3" in the second row of the second column indicates that the register R3 can be implemented using the logic element LE2.

The third column of FIG. 13 indicates whether the four-input look-up table 142 in each logic element is used. For example, the second row of the third column contains the entry "N" (no), indicating that the four-input look-up table 142 in logic element LE2 is not used in implementing the register R3. As another example, the third row of the third column contains the entry "Y (M1)" (yes), indicating that in logic element LE3, the four-input look-up table 142 is used to implement multiplexer M1.

The fourth column of table 158 indicates how multiplexer ML1 is configured for each logic element (i.e., whether the setting for ML1 directs its "1" input or its "0" input to be connected to its output). For example, in the third row of the fourth column of table 158, the entry "1" indicates that multiplexer ML1 is configured to connect its "1" input to its output in logic element LE3, so that the signals from look-up table 142 are routed to register 146.

The fifth column of table 158 indicates, for each logic element, whether register 146 is used. The entries in the fifth column also indicate which component is implemented using the register 146. For example, the third row of the fifth column of table 158 contains the entry "Y(R5)", indicating that the register R5 in FIG. 6 is implemented using the register 146 in logic element LE3. (In LE3, the programmable element 20 that is associated with register 146 is used to configure the register 146 as a positive-edge-triggered register, whereas in LE6, the register 146 is configured as a negative-edge-triggered register.)

The sixth column of table 158 shows how the multiplexer ML2 is always configured so that its "0" input is connected to logic element output 156.

Using the illustrative six-logic-element circuit implementation of table 158, the dynamic phase alignment receiver circuitry 66 of FIG. 6 can be implemented in programmable logic. To ensure that timing constraints are satisfied, it is generally preferred to implement multiplexer M3 using hardwired circuitry, rather than programmable logic. If desired, however, the multiplexer M3 may also be implemented using programmable logic.

Figure 14:
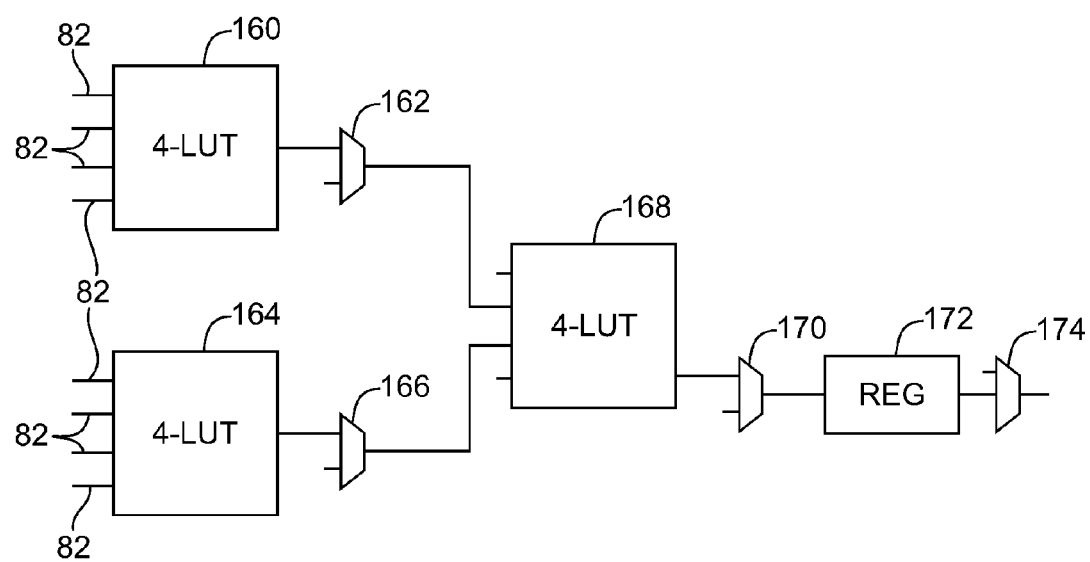
FIG. 14 is a diagram showing how the resources of three logic elements can be used to implement a dynamic phase alignment clock phase selection multiplexer and register for a dynamic phase alignment circuit in accordance with the present invention.

A circuit diagram showing how multiplexer M3 and register R1 can be implemented using the resources of three programmable logic elements 24 is shown in FIG. 14. As shown in FIG. 14, the eight inputs 82 to the multiplexer M3 are provided by combining four-input look-up table 160 and four-input look-up table 164. The output of look-up table 160 is routed through a bypass multiplexer 162. Bypass multiplexer 162 and four-input look-up table 160 are located in the same logic element (i.e., a first of the three logic elements). The output of look-up table 164 is routed through a bypass multiplexer 166. Bypass multiplexer 166 and four-input look-up table 164 are located in the same logic element (i.e., a second of the three logic elements). The resources of a third of the three logic elements are used to provide four-input look-up table 168, multiplexer 170, register 172, and multiplexer 174. By configuring the programmable elements in look-up tables 160, 164, and 168 during programming, look-up tables 160, 164, and 168 form multiplexer M3 of FIG. 6. Register 172 can be configured to serve as a positive-edge-triggered register when register 172 is serving as register R1 of FIG. 6. The circuit arrangement of FIG. 14 can also be used to implement the circuitry of multiplexer M3 in combination with register R2 (FIG. 6) by configuring register 172 to operate in negative-edge-triggered mode.

Figure 15:
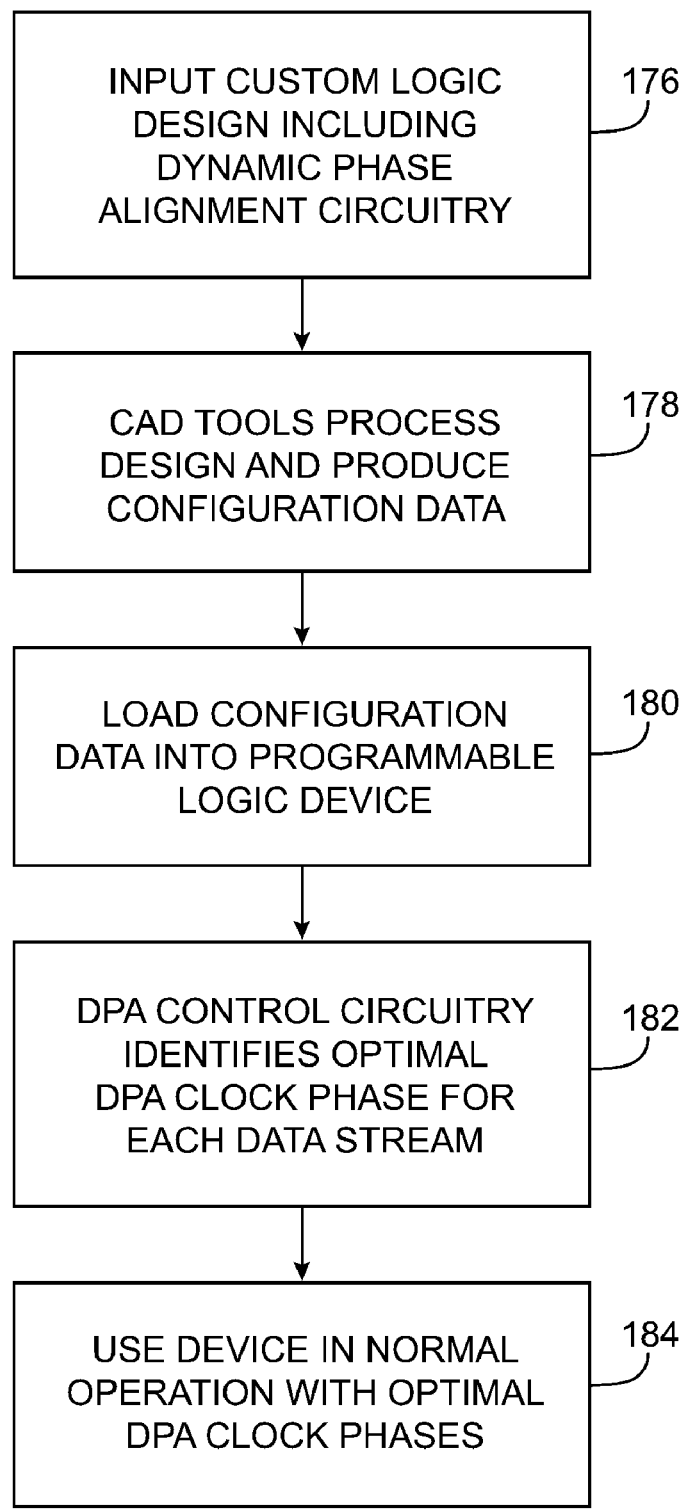
FIG. 15 is a flow chart of illustrative steps involved in configuring and using a programmable logic device with configurable dynamic phase alignment circuitry in accordance with the present invention.

Illustrative steps involved in setting up and using a programmable logic device integrated circuit 10 containing receivers with dynamic phase alignment circuitry are shown in FIG. 15.

At step 176, a user provides a desired custom logic design to computer-aided design tools on logic design system 56 (FIG. 3). The custom logic design specifies which receivers and corresponding dynamic phase alignment circuits are to be implemented to receive incoming data. If numerous dynamic phase alignment circuits are required, the circuit design can include numerous dynamic phase alignment circuits of the type shown in FIG. 6. If few dynamic phase alignment circuits are required, the circuit design can include only a few dynamic phase alignment circuits of the type shown in FIG. 6. In circuit designs that do not require certain dynamic phase alignment circuits to be implemented, circuit resources are made available for implementing other user logic, thereby minimizing overhead.

With one suitable arrangement, each dynamic phase alignment circuit that is formed can be implemented using a hardwired multiplexer M3 and six corresponding user-configured logic elements 24. Switches 86 can be used to distribute dynamic phase alignment clock signals over multiple edges of the device.

At step 178, the logic design system 56 processes the user's desired logic design and produces corresponding configuration data.

At step 180, the configuration data is loaded into the programmable elements 20 of the programmable logic device integrated circuit 10, thereby configuring the programmable logic device integrated circuit to perform the functions of the desired logic design.

At step 182, as training data is being transmitted from transmitter 60 (FIG. 4), the dynamic phase alignment circuits use control circuitry such as control circuit 102 of FIG. 6 to identify the optimal dynamic phase alignment clock phase to be used to capture data during normal operation. As described in connection with FIG. 6, the dynamic phase alignment control circuit 102 systematically takes measurements as data is captured using each of the available eight phases of the dynamic phase alignment clock signal.

After the optimal clock phase has been identified at step 182, the dynamic phase alignment control circuit 102 adjusts multiplexer M3 to route this phase of the clock signal to the output line 136 as the recovered clock signal REC CLK (step 184). During step 184, the recovered clock signal REC CLK is used to capture data. The programmable logic device 10 operates normally and data that has been captured and synchronized (e.g., DATA1 and DATA2) is processed by logic 64 (FIG. 4).

The foregoing is merely illustrative of the principles of this invention and various modifications can be made by those skilled in the art without departing from the scope and spirit of the invention.

What is claimed is:

1. A receiver circuit comprising:
a hardwired multiplexer having inputs that each receive a respective clock phase of a multiphase dynamic phase alignment clock signal and having an output at which a selected one of the clock phases is provided;
data capture registers and resynchronization registers formed from programmable logic, wherein the data capture registers have clock inputs that are connected to the output of the multiplexer; and
a dynamic phase alignment control circuit formed from programmable logic that applies a control signal to the multiplexer that directs the multiplexer to supply an optimal one of the clock phases to its output, wherein the programmable logic comprises a four-input look-up table that forms part of the dynamic phase alignment control circuit.

2. The receiver circuit defined in claim 1, wherein the multiphase dynamic phase alignment clock signal is provided to the inputs of the hardwired multiplexer from a phase-locked-loop circuit, the receiver circuit further comprising a system clock path that distributes one of the clock phases to the resynchronization registers as a system clock signal.

3. The receiver circuit defined in claim 1, wherein the multiphase dynamic phase alignment clock signal is provided to the inputs of the hardwired multiplexer from a phase-locked-loop circuit over a clock bus that distributes the dynamic phase alignment clock to a plurality of receivers, the receiver circuit further comprising a system clock path that distributes one of the clock phases to the resynchronization registers as a system clock signal.

4. The receiver circuit defined in claim 1, wherein the receiver receives an input data signal and wherein the data capture registers comprise first and second data capture registers that have data inputs that receive the input data signal for the receiver and that have clock inputs that receive the selected one of the clock phases.

5. The receiver circuit defined in claim 1, wherein the receiver receives an input data signal, wherein the data capture registers comprise first and second data capture registers that have data inputs that receive the input data signal for the receiver and that have clock inputs that receive the selected one of the clock phases, and wherein the first and second data capture registers are formed from respective first and second programmable logic device integrated circuit logic elements.

6. The receiver circuit defined in claim 1, wherein the receiver receives an input data signal, wherein the data capture registers comprise first and second data capture registers that have data inputs that receive the input data signal for the receiver and that have clock inputs that receive the selected one of the clock phases, and wherein the resynchronization registers comprise first, second, third, and fourth resynchronization registers.

7. The receiver circuit defined in claim 1, wherein the receiver receives an input data signal, wherein the data capture registers comprise first and second data capture registers that have data inputs that receive the input data signal for the receiver and that have clock inputs that receive the selected one of the clock phases, wherein the resynchronization registers comprise first, second, third, and fourth resynchronization registers, and wherein the first, second, third, and fourth resynchronization registers are formed from respective first, second, third, and fourth programmable logic device integrated circuit logic elements.

8. The receiver circuit defined in claim 1, wherein the receiver receives an input data signal, wherein the data capture registers comprise first and second data capture registers that have data inputs that receive the input data signal for the receiver and that have clock inputs that receive the selected one of the clock phases, wherein the resynchronization registers comprise first, second, third, and fourth resynchronization registers, wherein the first data capture register has a data output, wherein the first resynchronization register has a data input connected to the data output of the first data capture register, wherein the second data capture register has a data output, and wherein the second resynchronization register has a data input connected to the data output of the second data capture register.

9. The receiver circuit defined in claim 1, wherein the receiver receives an input data signal, wherein the data capture registers comprise first and second data capture registers that have data inputs that receive the input data signal for the receiver and that have clock inputs that receive the selected one of the clock phases, wherein the resynchronization registers comprise first, second, third, and fourth resynchronization registers, wherein the first data capture register has a data output, wherein the first resynchronization register has a data input connected to the data output of the first data capture register, wherein the second data capture register has a data output, wherein the second resynchronization register has a data input connected to the data output of the second data capture register, wherein a first data signal that is created when the input data signal is captured by the first data capture register is passed to a data output of the third resynchronization register, and wherein a second data signal that is created when the input data signal is captured by the second data capture register is passed to a data output of the fourth resynchronization register data.

10. The receiver circuit defined in claim 1, wherein the receiver circuit is formed on a programmable logic device integrated circuit containing a plurality of programmable logic device integrated circuit logic elements, each programmable logic device integrated circuit logic element containing a register and wherein the data capture registers each comprise a register from a respective one of the programmable logic device integrated circuit logic elements.

11. The receiver circuit defined in claim 1, wherein the receiver circuit is formed on a programmable logic device integrated circuit containing a plurality of programmable logic device integrated circuit logic elements, each programmable logic device integrated circuit logic element containing a register and wherein the resynchronization registers each comprise a register from a respective one of the programmable logic device integrated circuit logic elements.

12. The receiver circuit defined in claim 1, wherein the receiver circuit is formed on a programmable logic device integrated circuit containing a plurality of programmable logic device integrated circuit logic elements, each programmable logic device integrated circuit logic element containing a register, wherein each of the data capture registers comprises a register from a respective one of the programmable logic device integrated circuit logic elements, and wherein each of the resynchronization registers comprises a register from a respective one of the programmable logic device integrated circuit logic elements.

13. A receiver circuit comprising:
a hardwired multiplexer having inputs that each receive a respective clock phase of a multiphase dynamic phase alignment clock signal and having an output at which a selected one of the clock phases is provided;
data capture registers and resynchronization registers formed from programmable logic, wherein the data capture registers have clock inputs that are connected to the output of the multiplexer; and
a dynamic phase alignment control circuit formed from programmable logic that applies a control signal to the multiplexer that directs the multiplexer to supply an optimal one of the clock phases to its output, wherein the receiver receives an input data signal, wherein the data capture registers comprise first and second data capture registers that have data inputs that receive the input data signal for the receiver and that have clock inputs that receive the selected one of the clock phases, wherein the resynchronization registers comprise first, second, third, and fourth resynchronization registers, wherein the first data capture register has a data output, wherein the first resynchronization register has a data input connected to the data output of the first data capture register, wherein the second data capture register has a data output, wherein the second resynchronization register has a data input connected to the data output of the second data capture register, wherein a first data signal that is created when the input data signal is captured by the first data capture register is passed to a data output of the third resynchronization register, and wherein a second data signal that is created when the input data signal is captured by the second data capture register is passed to a data output of the fourth resynchronization register data, the receiver circuit further comprising:
first and second bypass multiplexers, wherein the first bypass multiplexer has a first input connected to a data output of the first resynchronization register and a second input connected to the data output of the first capture register, and wherein the second bypass multiplexer has a first input connected to a data output of the second resynchronization register and a second input connected to the data output of the second data capture register.

14. The receiver circuit defined in claim 13,
wherein the dynamic phase alignment control circuit processes the first and second data signals during training to determine which of the phases of the multiphase dynamic phase alignment clock signal produces is optimal when capturing the input data signal with the first and second data capture registers.

15. A programmable logic device integrated circuit comprising:
a phase-locked-loop circuit that generates a multiphase dynamic phase alignment clock;
a plurality of receivers, each receiving a respective input data signal from a transmitter on another integrated circuit;
a clock bus that distributes the dynamic phase alignment clock to the plurality of receivers; and
dynamic phase alignment circuitry in each receiver that includes:
a dynamic phase alignment clock selection multiplexer having inputs connected to respective lines in the clock bus and having an output that supplies a selected phase of the multiphase dynamic phase alignment clock;
first and second data capture registers having data inputs that receive the input data signal for the receiver and having clock inputs that receive the selected phase of the multiphase dynamic phase alignment clock;

first, second, third, and fourth resynchronization registers, wherein the first data capture register has a data output, wherein the first resynchronization register has a data input connected to the data output of the first data capture register, wherein the second data capture register has a data output, wherein the second resynchronization register has a data input connected to the data output of the second data capture register, wherein a first data signal that is created when the input data signal is captured by the first data capture register is passed to a data output of the third resynchronization register, and wherein a second data signal that is created when the input data signal is captured by the second data capture register is passed to a data output of the fourth resynchronization register data;

first and second bypass multiplexers, wherein the first bypass multiplexer has a first input connected to a data output of the first resynchronization register and a second input connected to the data output of the first capture register, and wherein the second bypass multiplexer has a first input connected to a data output of the second resynchronization register and a second input connected to the data output of the second capture register; and programmable logic configured as a dynamic phase alignment control circuit that processes the first and second data signals during training to determine which of the phases of the multiphase dynamic phase alignment clock signal produces is optimal when capturing the input data signal with the first and second data capture registers.

16. A method of receiving an input data signal with a programmable logic device integrated circuit, comprising:
providing a custom logic design including dynamic phase alignment circuitry to a computer-aided-design tool;
using the computer-aided-design tool to process the design and produce corresponding configuration data for the programmable logic device integrated circuit;
loading the configuration data into the programmable logic device integrated circuit to program the programmable logic device integrated circuit to implement the custom logic design including the dynamic phase alignment circuitry from programmable logic; and
during normal operation of the programmable logic device integrated circuit, using the dynamic phase alignment circuitry that is formed from programmable logic to receive the input data signal and to select a clock phase from a multiphase clock signal, wherein the programmable logic comprises a four-input lookup table that forms a part of the dynamic phase alignment circuitry.

17. The method defined in claim 16, wherein the dynamic phase alignment circuitry that is formed from programmable logic contains data capture registers formed from programmable logic device integrated circuit logic elements on the programmable logic device integrated circuit, the method further comprising using the selected clock phase to clock the data capture registers formed from the programmable logic device integrated circuit logic elements to capture the input data signal.

18. The method defined in claim 16, wherein the dynamic phase alignment circuitry that is formed from programmable logic contains resynchronization registers formed from programmable logic device integrated circuit logic elements on the programmable logic device integrated circuit, the method further comprising using a given phase of the multiphase clock signal to clock the resynchronization registers.

19. The method defined in claim 16, wherein the dynamic phase alignment circuitry that is formed from programmable logic contains data capture registers formed from programmable logic device integrated circuit logic elements on the programmable logic device integrated circuit and contains resynchronization registers formed from programmable logic device integrated circuit logic elements on the programmable logic device integrated circuit, the method further comprising:
using the selected clock phase to clock the data capture registers formed from the programmable logic device integrated circuit logic elements to capture the input data signal;
providing the captured input data signal to the resynchronization registers; and
using a given phase of the multiphase clock signal to clock the resynchronization registers.

20. A method of receiving an input data signal with a programmable logic device integrated circuit, comprising:
providing a custom logic design including dynamic phase alignment circuitry to a computer-aided-design tool;
using the computer-aided-design tool to process the design and produce corresponding configuration data for the programmable logic device integrated circuit;
loading the configuration data into the programmable logic device integrated circuit to program the programmable logic device integrated circuit to implement the custom logic design including the dynamic phase alignment circuitry from programmable logic; and
during normal operation of the programmable logic device integrated circuit, using the dynamic phase alignment circuitry that is formed from programmable logic to receive the input data signal and to select a clock phase from a multiphase clock signal, wherein the dynamic phase alignment circuitry that is formed from programmable logic contains data capture registers formed from programmable logic device integrated circuit logic elements on the programmable logic device integrated circuit, contains resynchronization registers formed from programmable logic device integrated circuit logic elements on the programmable logic device integrated circuit, and contains a dynamic phase alignment control circuit formed from programmable logic on the programmable logic device integrated circuit, wherein each programmable logic device integrated circuit logic element includes a register, a programmable look-up table, and programmable multiplexer circuitry, the method further comprising:
using a multiplexer controlled by the dynamic phase alignment control circuit to separate the selected clock phase from the multiphase clock signal;
using the selected clock phase to clock the data capture registers formed from the programmable logic device integrated circuit logic elements to capture the input data signal;
providing the captured input data signal to the resynchronization registers; and
using a given phase of the multiphase clock signal to clock the resynchronization registers.

* * * * *

UNITED STATES PATENT AND TRADEMARK OFFICE
CERTIFICATE OF CORRECTION

PATENT NO. : 7,644,296 B1 Page 1 of 1
APPLICATION NO. : 11/488429
DATED : January 5, 2010
INVENTOR(S) : Ali Burney It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 533 days.

Signed and Sealed this

Twenty-first Day of December, 2010

David J. Kappos
*Director of the United States Patent and Trademark Office*